United States Patent
Schenck et al.

(10) Patent No.: US 6,437,567 B1
(45) Date of Patent: *Aug. 20, 2002

(54) RADIO FREQUENCY COIL FOR OPEN MAGNETIC RESONANCE IMAGING SYSTEM

(75) Inventors: John Frederick Schenck, Clifton Park; Ronald Dean Watkins, Niskayuna; William Alan Edelstein, Schenectady; Sayed-Amr El-Hamamsy, Niskayuna, all of NY (US); Eddy B. Boskamp, Menomonee Falls, WI (US); Randy Otto John Giaquinto, Burnt Hills; John Andrew Mallick, Scotia, both of NY (US)

(73) Assignee: General Electric Company, Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/455,430

(22) Filed: Dec. 6, 1999

(51) Int. Cl.[7] ................................................. G01V 3/00
(52) U.S. Cl. ........................................ 324/318; 600/422
(58) Field of Search ................... 324/318, 322, 324/307, 309, 300, 306; 600/422, 424, 423

(56) References Cited

U.S. PATENT DOCUMENTS

| | | | | |
|---|---|---|---|---|
| 4,680,548 A | | 7/1987 | Edelstein et al. | 324/318 |
| 4,692,705 A | | 9/1987 | Hayes | 324/318 |
| 4,694,255 A | | 9/1987 | Hayes | 324/318 |
| 4,968,937 A | | 11/1990 | Akgun | 324/318 |
| 5,386,191 A | * | 1/1995 | McCarten et al. | 324/318 |
| 5,467,017 A | | 11/1995 | Duerr et al. | 324/318 |
| 5,682,098 A | * | 10/1997 | Vij | 324/318 |
| 6,215,307 B1 | * | 4/2001 | Sementchenko | 324/318 |
| 6,249,121 B1 | * | 6/2001 | Boskamp et al. | 324/318 |

* cited by examiner

Primary Examiner—Edward Lefkowitz
Assistant Examiner—Tiffany A. Fetzner
(74) Attorney, Agent, or Firm—Jean K. Testa; Jill M. Breedlove

(57) ABSTRACT

A quadrature coil suitable for use with an open frame MRI system provides crossing pairs of arrays of parallel conductor elements, respectively. Compact configuration is provided through use of an isolating circuit for incorporating parasitic capacitances at the resonance frequency of the coil into a blocking parallel resonance. Termination of the parallel conductor elements may be accomplished by equal impedance node connectors formed from branching pairs of conductors or a triangular least resistance connection form. RF shields are provided by pairs of conductive sheets containing eddy current reducing slots aligned with the parallel conductors elements of the coil.

9 Claims, 4 Drawing Sheets

RADIO FREQUENCY COIL FOR OPEN MAGNETIC RESONANCE IMAGING SYSTEM

BACKGROUND OF THE INVENTION

The present invention relates generally to magnetic resonance imaging (MRI) systems and, more specifically, to a design for a radio frequency coil for an open magnet MRI system.

Magnetic resonance imaging systems provide images of internal structures of the human body and the like by detecting radio signals produced by the precessing spins of the atomic nuclei of the structure when the structure is placed in a strong polarizing magnetic field. The nuclear spins are first excited into precession by a radio frequency (RF) stimulation pulse. Next the spins are isolated spatially by application of one or more gradient magnetic fields that cause their precession frequency to deviate from that provided by the polarizing magnetic field alone. The isolated resonance signals produced by these precessing nuclear spins are detected and processed according to techniques well known in the art to produce tomographic or volumetric images.

A single antenna may be used to transmit the stimulating RF pulse and to receive the weaker resonance signals from the precessing nuclei although often separate antennas are used for these two purposes.

In a prior art "closed" MRI system, a polarized gradient magnetic field is produced by a cylindrical, annular magnet having a bore for admitting a patient along the axis of the cylinder aligned with the magnetic field B0. Nuclei precession within the patient is induced by an RF field providing a magnetic vector in a plane perpendicular to the B0 axis.

For certain procedures, particularly surgical procedures, an "open" MRI system may be desired in which the annular magnet of the closed MRI system is replaced by opposed magnetic pole faces providing therebetween a relatively unobstructed opening into which a patient may be placed while preserving greater access to the patient than in a closed MRI system. In the open MRI system, the B0 field extends between the pole faces and the RF field is kept perpendicular to the B0 field.

In open MRI systems, to avoid unduly restricting access to the patient through the opening between opposed magnetic pole faces, one or more arrays of parallel conductors positioned near the pole faces are used to provide the RF field. These conductors are energized in a manner that produces a net RF vector in the desired plane perpendicular to the B0 axis.

While a single opposed pair of RF coils may be used for producing an oscillating RF field along a single line, preferably each such RF coil is matched to a second array having perpendicularly running conductor elements. For the RF stimulating pulse, the two matched RF coils are energized with signals having a 90 degree phase difference so as to create a rotating RF field. For reception of the resonance signal, signals detected at the crossing RF coils are combined with the appropriate 90 degree phase difference to produce a signal with superior signal-to-noise ratio. Coils providing for perpendicular reception or transmission patterns are known generally as "quadrature" coils.

A radio frequency shield may be placed between the RF coils and coils that produce the gradient magnetic field described above, so as to prevent signal from the gradient coils from interfering with reception of signals by the RF coils. Such radio frequency shields may be used as a return conductor path for an RF coil.

While open frame MRI systems provide greater access to a patient for surgical and other procedures than closed MRI systems, providing a high degree of homogeneity for the radio frequency and magnetic fields necessary for high quality imaging is still a challenge. In this regard, it is important that the pole faces be as close as possible to each other, and therefore that the RF coils and radio frequency shield be as close as possible to each other as well. Providing this homogenous RF reception and transmission field with a compact coil structure remains an important area of development.

BRIEF SUMMARY OF THE INVENTION

A number of improvements to the design of quadrature coils suitable for open frame MRI systems are set forth herein.

While it is not possible to produce the ideally desired perfectly uniform RF field between the pole faces, conductor patterns designed to approximate the geometry of uniform current sheets parallel to the magnet pole faces are herein used to achieve a high degree of approximation to the desired RF field over the central imaging region.

Although the conductor elements of each coil array of a quadrature coil will be perpendicular and therefore theoretically isolated, in fact there exists significant capacitive coupling between such elements, particularly when the elements are placed in close proximity as is desired in an open frame MRI system. A first feature of the invention is an isolation circuit canceling out this capacitive effect.

Conventional termination of the conductor elements of the arrays is unduly resistive and/or promotes unequal current flow through these elements, limiting homogeneity of the resulting field. Accordingly, a second feature of the invention is an improved termination for these conductor elements that provides greater and more equal current flow. Additionally, a series connection between the coil arrays ensures identically matching current flows through the upper and lower corresponding conductor elements. An effective RF shield is provided for such quadrature coils which accommodates both transmission of magnetic field gradients and reduction of interaction between the gradient coils and the RF coil.

Specifically, a quadrature RF coil for an open MRI system is provided. The MRI system includes a polarizing magnet with opposed pole faces for establishing a polarizing field axis. The coil includes a first conductor array having separate and substantially aligned conductor elements positioned along a first conductor axis and extending across the polarizing field axis between opposed common connection points. A second conductor array includes separated and substantially aligned conductor elements positioned along a second conductor axis extending across the polarizing field axis between opposed common connection points, and extending perpendicularly to the first conductor elements. A combiner/splitter electrically coupled to a connection point of each of the first and second conductor arrays joins them with a common signal line so that a signal path between the common signal line and the connection point of the first conductor array is substantially 90 degrees out of phase with a signal path between the common signal line and the connection point of the second conductor array.

An isolation circuit joins the connection points of each of the first and second conductor arrays to create between the first and second conductor arrays a blocking parallel resonance at the operating radio frequency. The isolation circuit may comprise an adjustable inductor for providing parallel resonance in combination with a parasitic capacitive coupling between the overlying conductors of the first and second conductor array. For flexibility in tuning this circuit, a fixed or variable capacitor may be added between the first and second conductor arrays so as to be coupled in parallel with the parasitic capacitance.

Thus the invention, in one embodiment, constitutes an extremely compact planar coil suitable for use in open MRI systems providing high signal-to-noise ratio and quadrature detection. Because an extremely low profile RF coil may be constructed if parasitic capacitance between the elements is overcome, insertion of the inductor to convert this parasitic capacitance into a blocking parallel resonant circuit at the RF frequency, effectively eliminates its effect at the frequencies of interest.

Ideally, the radio-frequency body coil would produce a perfectly uniform magnetic field with a direction perpendicular to the static magnetic field produced by the magnetic pole faces. The direction perpendicular to the pole faces is parallel to the static magnetic field and is taken as the direction of the z-axis in a Cartesian coordinate system. A uniform, infinite, y-directed sheet of current with surface current density $\lambda_y$ does not produce any magnetic field in the y or z directions. The field in the x-direction is given by the expression $$B_x = \mu_o \lambda_y \text{ for } z > z_o$$

and $$B_x = -\mu_o \lambda_y \text{ for } z < z_o.$$

Therefore, two such current sheets with equal but oppositely directed current densities, one located at $z=z_o$, slightly below the upper pole face, and the other at $z=-z_o$, slightly above the lower pole face, will produce a magnetic field $$B_x = 2\mu_o \lambda_y \text{ for } -z_o < z < z_o$$

and $$B_x = 0 \text{ for } z < -z_o \text{ or } z > z_o.$$

In theoretical terms this idealized pair of current sheets is an optimized source for the radio-frequency field of an open MR scanner from two points of view:

(1) The field between the current sheets is completely uniform and independent of position.

(2) The current sheets provide no obstruction to the region of the gap between the pole faces ($-z_o < z < z_o$). However, because of its infinite extent, a coil consisting of such a pair of current sheets is not a practical design for an MR scanner. Furthermore, a large area conducting sheet of metal such as copper would shield the imaging region from the fields of the switched gradient coils which are typically required in MR imaging and which are located in the space between the RF coils and the magnetic pole faces. In a preferred embodiment of the invention, practical coil designs are provided which approximate the desirable properties of the pair of infinite uniform current sheets as just described.

A pair of coils, each with its primary conducting elements located within a rectangular region near to and parallel with the magnet pole faces, can form a practical approximation to the ideal pair of current sheets. This region is taken to be of width W in the x-direction and length L in the y-direction. A number N of equally spaced conductor strips, each parallel to the y-axis and extending from $y=-L/2$ to $y=L/2$ and each carrying the same y-directed current, are placed within this rectangle and arranged symmetrically around, and parallel to, the y-axis. The same pattern, but with oppositely directed currents, is placed on the lower pole face. By increasing the number of strips so that the space between them becomes negligible and allowing W and L to become arbitrarily large, the magnetic field pattern of this coil pair approaches that of the ideal pair of conducting sheets discussed above. If N is odd, there will be a conducting strip on each coil at the x-location given by $x_o=0$ and an additional $(N-1)/2$ pairs of conducting strips located at $x_o(n)=\pm n \, W/(N-1)$ for $1 \leq n \leq (N-1)/2$. If N is even there will be on each coil N/2 pairs of strips at $x_o(n)=\pm(n-1/2) \, W/(N-1)$ for $1 \leq n \leq N/2$.

Because the parallel sets of conductors just described do not form closed electric circuits, it is necessary to provide additional conducting elements whose purpose is not primarily to produce the magnetic field in the imaging region but, rather, to close the conducting circuits of each of these two conductor arrays. A number of alternative possibilities are available for completing the circuit paths and the most desirable means of doing this will depend on the particular imaging application and system design being utilized. If the current elements closing the path are located remotely from the region of imaging, the field in the imaging region will be substantially that of the linear conductor arrays. This field is described below.

Applying the Biot-Savart law to a single linear current element which extends in the y-direction from $y=-L/2$ to $y=L/2$ and is located at $x=x_o$ and $z=z_o$ leads to the following expressions for the magnetic field components at the field point (x,y,z).

$$B_x = \frac{\mu_o}{4\pi} \frac{z - z_o}{(x - x_o)^2 + (z - z_o)^2}$$

-continued $$\left[\frac{L/2-y}{\sqrt{(L/2-y)^2+(x-x_o)^2+(z-z_o)^2}} + \frac{L/2+y}{\sqrt{(L/2+y)^2+(x-x_o)^2+(z-z_o)^2}}\right]$$

$$B_y = 0$$

$$B_z = \frac{\mu_o}{4\pi} \frac{x-x_o}{(x-x_o)^2+(z-z_o)^2}$$

$$\left[\frac{L/2-y}{\sqrt{(L/2-y)^2+(x-x_o)^2+(z-z_o)^2}} + \frac{L/2+y}{\sqrt{(L/2+y)^2+(x-x_o)^2+(z-z_o)^2}}\right].$$

A complete coil pair will contain N linear conductors at $x_o=x_o(n)$ and $z=z_o$ and N additional conductors at $x_o=x_o(n)$ and $z=-z_o$ where n runs from n=1 to n=N. The total field produced by the two linear arrays is then given by $$B_x = \sum_{n=1}^{N} B_x(x_o(n), z_o) + \sum_{n=1}^{N} B_x(x_o(n), -z_o)$$

$$B_y = 0$$

$$B_z = \sum_{n=1}^{N} B_z(x_o(n), z_o) + \sum_{n=1}^{N} B_z(x_o(n), -z_o).$$

For a single conducting element, if the length L of the conductor becomes very long compared to the quantities $(x-x_o)$ and $(z-z_o)$, then $$B_x \to \frac{\mu_o}{2\pi} \frac{z-z_o}{(x-x_o)^2+(z-z_o)^2}$$

$$B_y = 0$$

$$B_z \to \frac{\mu_o}{2\pi} \frac{x-x_o}{(x-x_o)^2+(z-z_o)^2}.$$

At the center of the imaging volume $(x,y,z)=(0,0,0)$ and the central field of an individual conducting strip is given by $$B_x = -\frac{\mu_o}{4\pi} \frac{Lz_o}{(x_o^2+z_o^2)\left(\frac{L^2}{4}+x_o^2+z_o^2\right)^{1/2}}$$

$$B_y = 0$$

$$B_z = \frac{\mu_o}{4\pi} \frac{Lx_o}{(x_o^2+z_o^2)\left(\frac{L^2}{4}+x_o^2+z_o^2\right)^{1/2}}.$$

If N is even in the symmetry of the inventive coil, all current elements can be grouped in groups of four wires with positive currents at $(x_o,z_o)$ and $(-x_o,z_o)$ and negative currents at $(x_o,-z_o)$ and $(-x_o,-z_o)$. This group of four wires produces a central field given by $$B_x = -\frac{\mu_o}{\pi} \frac{Lz_o}{(x_o^2+z_o^2)\left(\frac{L^2}{4}+x_o^2+z_o^2\right)^{1/2}}$$

$$B_y = 0$$

$$B_z = 0.$$

The total central field is determined by summing over all of the groups of four wires that are present in the coil. If N is odd, there is an additional contribution from the pair of wires at $(x_o=0, z_o)$ and $(x_o=0,-z_o)$ which must also be added to the field of the other conductors. The central field of this wire pair is $$B_x = -\frac{\mu_o}{2\pi} \frac{Lz_o}{\left(z_o^2\left(\frac{L^2}{4}+z_o^2\right)\right)^{1/2}}$$

$$B_y = 0$$

$$B_z = 0.$$

Therefore, this coil geometry, as desired, produces a magnetic field that is predominately in the x-direction near the center of the magnet gap.

The first and second conductor arrays may be comprised of copper foil laminated to opposite sides of a planar insulating substrate, as typified in conventional printed circuit technology, and the isolation circuit may be coupled to adjacent common connection points on opposite sides of the planar insulating substrate. This simplifies fabrication of extremely compact quadrature coils for open frame MRI systems. The printed circuit technology registers the first and second conductor arrays precisely with respect to each other and allows the isolation circuit to operate by connecting to adjacent coil ends through a small aperture in the insulating substrate.

The conductor elements of each conductor array may be connected together via a first node connection connecting the first ends of the conductor elements to a first node and a second node connection connecting the second ends of the conductor elements to a second node. The nodes may in turn be connected to an RF signal line for driving the conductor array or receiving signals from the conductor array. The first and second node connections may provide equal impedance paths between each of the ends and the respective nodes. This may be done by providing equal path links between each end and the respective node and, more particularly, by providing a set of separate equal length branches from a signal node, each branch branching again into a second set of separate equal length branches which ultimately connect to the ends of the conductor elements. The connection of the conductor elements of the arrays thus promotes equal current through each conductor element, simplifying construction of the resulting field and improving its homogeneity.

In a second preferred embodiment, the first and second node connections provide substantially non-overlapping straight line paths between the respective ends and the node. This may be realized by a substantially continuous isosceles triangular conductor having its node at the apex and the ends of the conductor elements distributed along the base of the isosceles triangular conductor. In this manner a lowest possible resistance connection between each of the conductor elements and the node is provided.

The coil of the invention may include an RF shield for a quadrature coil, the latter having a first conductor array and a second perpendicular conductor array. The RF shield provides a conductive surface interrupted by channels substantially aligned with the conductor elements of both the first and second conductor arrays. The channels of this RF shield prevent eddy current formation caused by excitation of gradient coil fields such as might interfere with the RF coil and/or reduce the power or affect the shape of the gradient coils.

The channels aligned with the conductor elements of the first conductor array may be on a first conductive sheet and the channels aligned with the conductor elements of the second conductor array may be on a second conductive sheet adjacent to the first conductive sheet. The channels may be bridged by capacitors sized to provide low admittance at the operational radio frequency. The RF shield is thus easily manufactured.

A quadrature coil set comprised of four crossing conductor arrays may be placed at the pole of the open frame MRI magnet, with a first and third conductor array being at opposite poles and having parallel conductor elements, and a second and fourth conductor array being at opposite poles and having parallel conductor elements perpendicular to the conductor elements of the first and third array. Interconnection leads may connect the first and third conductor arrays in series through their connection points and may connect the second and fourth conductor arrays and series through their connection points, thus promoting opposite current flows through the first and third conductor arrays and through the second and fourth conductor arrays.

DETAILED DESCRIPTION OF THE INVENTION

Figure 1:
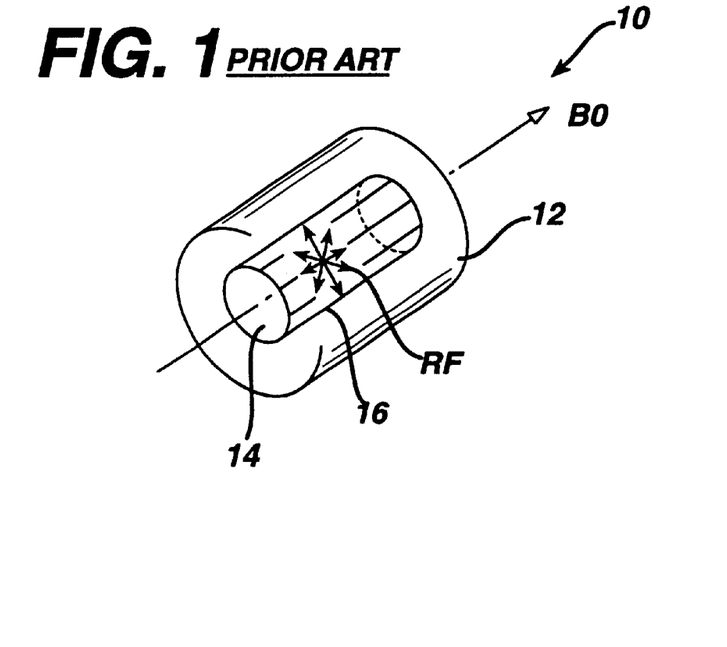
FIG. 1 is a simplified view of the architecture of a conventional closed MRI system showing orientation of the polarizing field and the perpendicular RF field.

FIG. 1 illustrates a prior art "closed" MRI system 10 wherein a polarized magnetic field B0 is produced by a cylindrical, annular magnet 12 having a bore 14 for admitting a patient along the axis of the cylinder aligned with the magnetic field B0. Precession of nuclei within the patient in bore 14 is induced by an RF field providing a magnetic vector in a plane perpendicular to the B0 axis. This RF field may be produced by a so called "bird cage" coil 16 having an electrically resonant antenna structure that produces a rotating magnetic field within the desired plane. Exemplary bird cage coils are taught in Hayes U.S. Pat. No. 4,692,705, issued Sep. 8, 1987, and U.S. Pat. No. 4,694,255, issued Sep. 15, 1987, and Edelstein et al. U.S. Pat. No. 4,680,548, issued Jul. 14, 1987, each of which patent is assigned to the instant assignee and hereby incorporated by reference. The term "coil" is used herein synonymously with the term "antenna" and does not require a coil shape.

Figure 2:
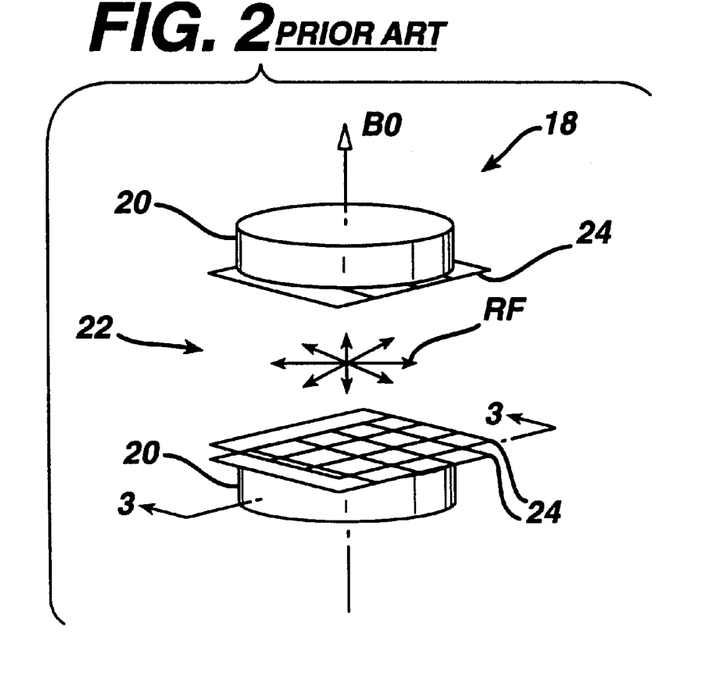
FIG. 2 is a simplified view, similar to that of FIG. 1, showing the architecture of an open MRI system and the relative positions of the polarizing and RF fields.
Figure 3:
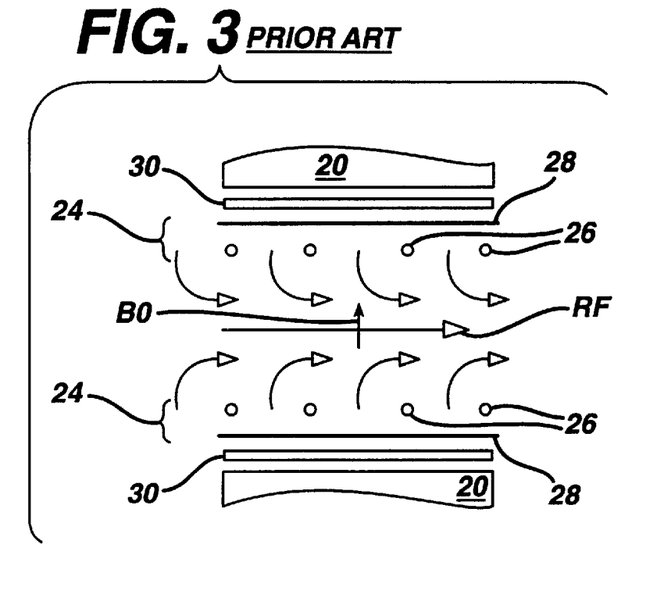
FIG. 3 is a cross sectional view along line 3—3 of FIG. 2 showing superposition of the fields of the conductor elements of the conductor arrays of FIG. 2 which provide a perpendicular RF field.

FIG. 2 illustrates an "open" MRI system 18 which is useful for certain procedures, and particularly for surgical procedures. In this open MRI system, annular magnet 12 of the closed MRI system shown in FIG. 1 is replaced by opposed magnetic pole faces 20 providing therebetween a relatively unobstructed opening 22 into which a patient may be placed while preserving greater access to the patient. In the open MRI system, the B0 field extends between pole faces 20 (vertically as depicted) and the RF field is likewise rotated to remain perpendicular to the B0 field. While a bird cage coil, such as coil 16 of FIG. 1, could be used in this application, such coil is undesirable to the extent that it may unduly restrict the newly opened access to the patient. Therefore, in open MRI systems, one or more arrays of parallel conductors positioned near pole faces 20 may constitute an RF coil 24. FIG. 3 illustrates individual conductor elements 26 of the opposed RF coils 24 energized with current flowing in opposite directions so as to produce a net RF vector in the desired plane perpendicular to the B0 axis.

While a single opposed pair of RF coils may be used for producing an oscillating RF field along a single line, preferably each such RF coil 24 is matched to a second array having perpendicularly running conductor elements 26. For the RF stimulating pulse, the two matched RF coils 24 are energized with signals having a 90 degree phase difference so as to create a rotating RF field as depicted generally in FIG. 2. For reception of the resonance signal, signals detected at the crossing RF coils 24 are combined with the appropriate 90 degree phase difference to produce a signal with superior signal-to-noise ratio. Coils providing for perpendicular reception or transmission patterns are known generally as "quadrature" coils.

A radio frequency shield 28 may be placed between RF coils 24 and gradient coils 30, as shown in FIG. 3, so as to prevent signal from the gradient coils from interfering with reception of signals by RF coils 24. Each such radio frequency shield 28 may be used as a return conductor path for a respective RF coil. In order to maintain a high degree of homogeneity for the radio frequency and magnetic fields, pole faces 20 must be situated as close as possible to each other, and therefore RF coils 24 and radio frequency shield 28 should also be as close as possible to each other.

Figure 4:
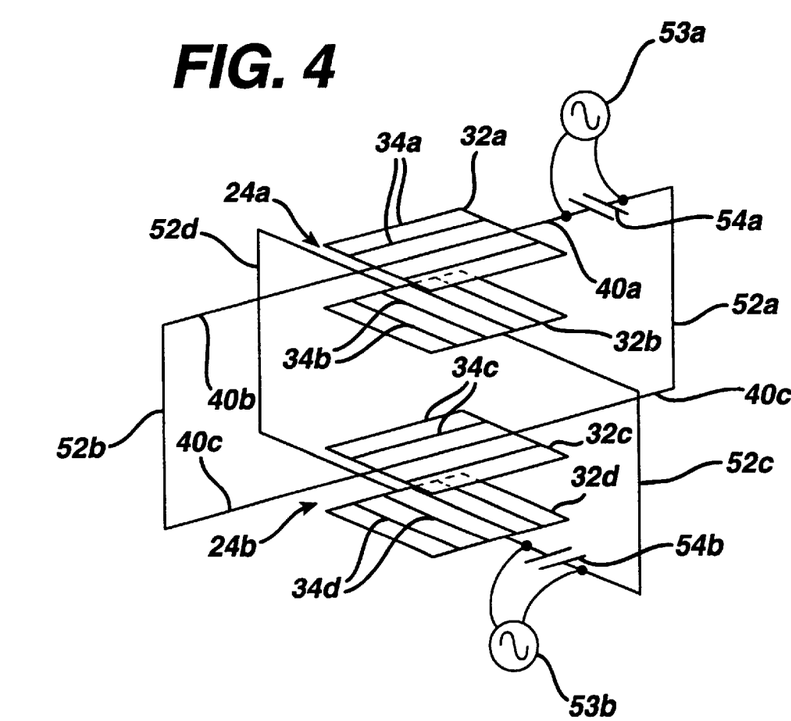
FIG. 4 is a view of four conductor arrays arranged in quadrature configuration and connected in series in accordance with a first embodiment of the invention.

As shown in FIG. 4, an open MRI system in accordance with a preferred embodiment of the invention includes opposed RF coils 24a and 24b situated, respectively, at each pole face 20, and each coil is composed of two conductor arrays. Thus RF coil 24a includes conductor arrays 32a and 32b while RF coil 24b includes conductor arrays 32c and 32d. Each of conductor arrays 32a–32d is composed, respectively, of a planar set of substantially parallel conductor elements 34a–34d arranged to extend substantially perpendicularly to the polarizing axis B0. Conductor elements 34a and 34c of conductor arrays 32a and 32c, respectively, are parallel to each other and perpendicular to conductor elements 34b and 34d of conductor arrays 32b and 32d, respectively, so that the conductor arrays of each of RF coils 24a and 24b may produce or detect RF signals in quadrature along mutually perpendicular axes.

Figure 5:
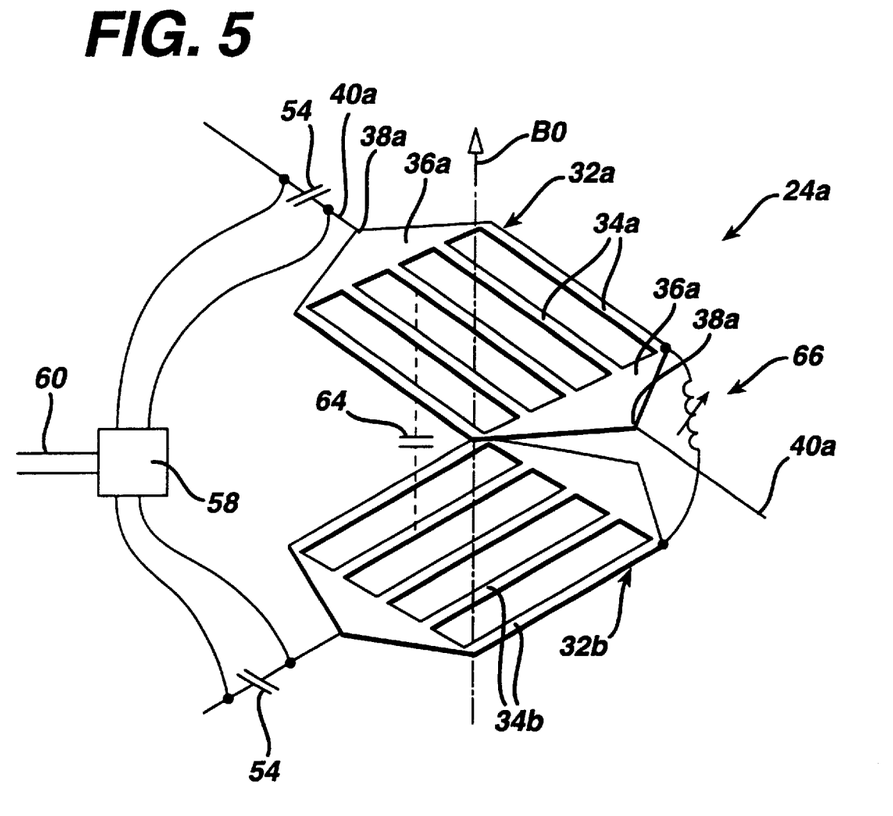
FIG. 5 is a detailed fragmentary view of one of the quadrature coil sets of FIG. 4 showing use of a combiner/splitter to produce the quadrature phased excitation signals and to combine received signals in quadrature for improved signal to noise ratio.

FIG. 5 shows each of the ends of conductor elements 34a being connected together by two independent node connectors 36a respectively, with one of the node connectors electrically joining first ends of conductor elements 34a together and the second of the node connectors electrically joining opposing second ends of conductor elements 34a together so that the conductor elements may be attached to nodes 38a and from there to signal lines 40a. Similar connections are made for array 32b of coil 24a with similar reference numbers and a "b" suffix, and similar connections are also made for arrays 32c and 32d of coil 24b (not shown in FIG. 5).

Figure 6:
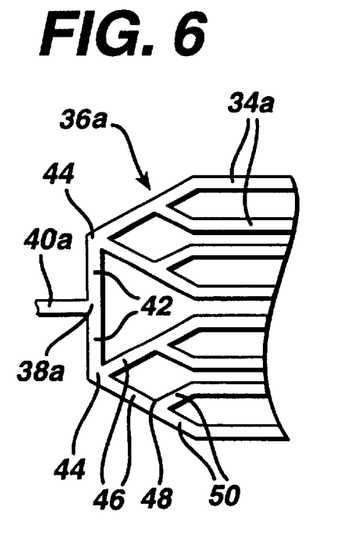
FIG. 6 is a detailed fragmentary view of a node connector providing for equal length connections between the conductor elements of one conductor array and a node for receiving or transmitting signals from the conductor elements.

Each node connector, such as connector 36a, may provide for an equal impedance connection between its node 38a and each of the conductor elements, such as elements 34a, by way of a branching structure as shown in FIG. 6, in which equal length constant width branches 42 extend from node 38a to secondary nodes 44 and branch again at secondary nodes 44 into secondary branches 46 also of equal length and width and hence equal impedance. Each of secondary branches 46 may proceed to tertiary nodes 48 to create tertiary branches 50 that ultimately communicate with ends of the conductor elements. Each of the primary, secondary and tertiary branches need only be of equal length within their rank (as primary, secondary and tertiary) so that any path between node 38a and an end of conductor element 34a has the same path length (and cross-sectional configuration) and hence the same impedance. In this way, current is evenly divided among the conductor elements and does not disproportionately flow through the center conductor element of the RF coil. This greatly simplifies construction of the coil, eliminating any need for variable width conductor elements or variation in the spacing of the conductor elements. These latter variations may be reserved for correcting for higher order errors rather than for fundamental differences in current flow. It will also be understood that this branching approach may be used for any number of conductor elements equal to a power of 2.

Figure 7:
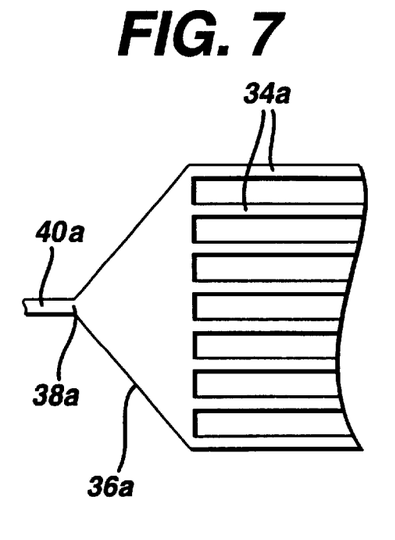
FIG. 7 is a view similar to that of FIG. 6 showing an alternative embodiment of the node connector with reduced resistance between the node and the conductor elements.

In an alternative embodiment, shown in FIG. 7, node connector 36a may be a solid sheet of conductor in an isosceles triangle pattern where the apex of the triangle is node 38a and the base connects to the ends of conductor elements 34a. This creates a direct path in a straight line, and hence the shortest possible path, between node 38a and the ends of conductor elements 34a. By allowing these paths to be non-overlapping, resistance between node 38a and each of conductor elements 34a is minimized. For this non-overlapping situation to occur, the height of the isosceles triangle measured from apex to base is substantially greater than three times the width of an average conductor element 34a.

As shown in FIG. 4, opposed conductor arrays 32a and 32c having conductor elements 34 oriented in parallel, may be connected in series by interconnection leads 52a and 52b joining signal lines 40a and 40c so as to place conductor arrays 32a and 32c in series in a continuous loop, thus providing for countervailing currents as described with respect to FIG. 3. An excitation signal 53a may be applied across a capacitor 54a positioned along this loop formed by interconnections 52a and 52b, or alternatively, a resonance signal may be extracted across capacitor 54a during acquisition of the resonance signal. Similarly, conductor arrays 32b and 32d having parallel oriented conductor elements 34b and 34d may be interconnected by leads 52c and 52d and a signal 53b may be inserted across a series connected capacitor 54b or received across that capacitor in a manner similar to that described above. Conductor arrays 32a and 32c, and 32b and 32d, may alternatively be driven in parallel using properly phased signals, as known in the art, with the advantage of not requiring any direct cabling across the magnet gap.

Conductors 52a–52d may comprise coaxial cable and be routed so as to provide greater accessibility to the area between pole faces 20.

In an alternative embodiment, capacitor 54a or 54b may be centered within one of conductor elements 34a and 34b, or 34c and 34d, respectively, near the edge of the conductor arrays. In this instance, the current conducted by the other conductor elements runs counter to the conductor element having the capacitor for introducing the signal. In this configuration, a separate voltage with 180° phase shift may be provided to the lower conductor arrays 32c and 32d. This configuration has the disadvantage that the conductor element used for the connection across the capacitor carries current in the opposite direction to the rest of the conductor elements in the array, reducing the strength and uniformity of the generated RF field.

Signals 53a and 53b will generally have a 90° phase separation and so may be combined by a combiner/splitter 58, shown in FIG. 5, to provide a single quadrature signal on a signal line 60 having an improved signal-to-noise ratio. Combiner/splitter 58 may be a hybrid circuit of a type well known in the art. Likewise, an excitation signal received from line 60 may be split by combiner/splitter 58 to excite the coils in quadrature for the reverse effect.

Figure 8:
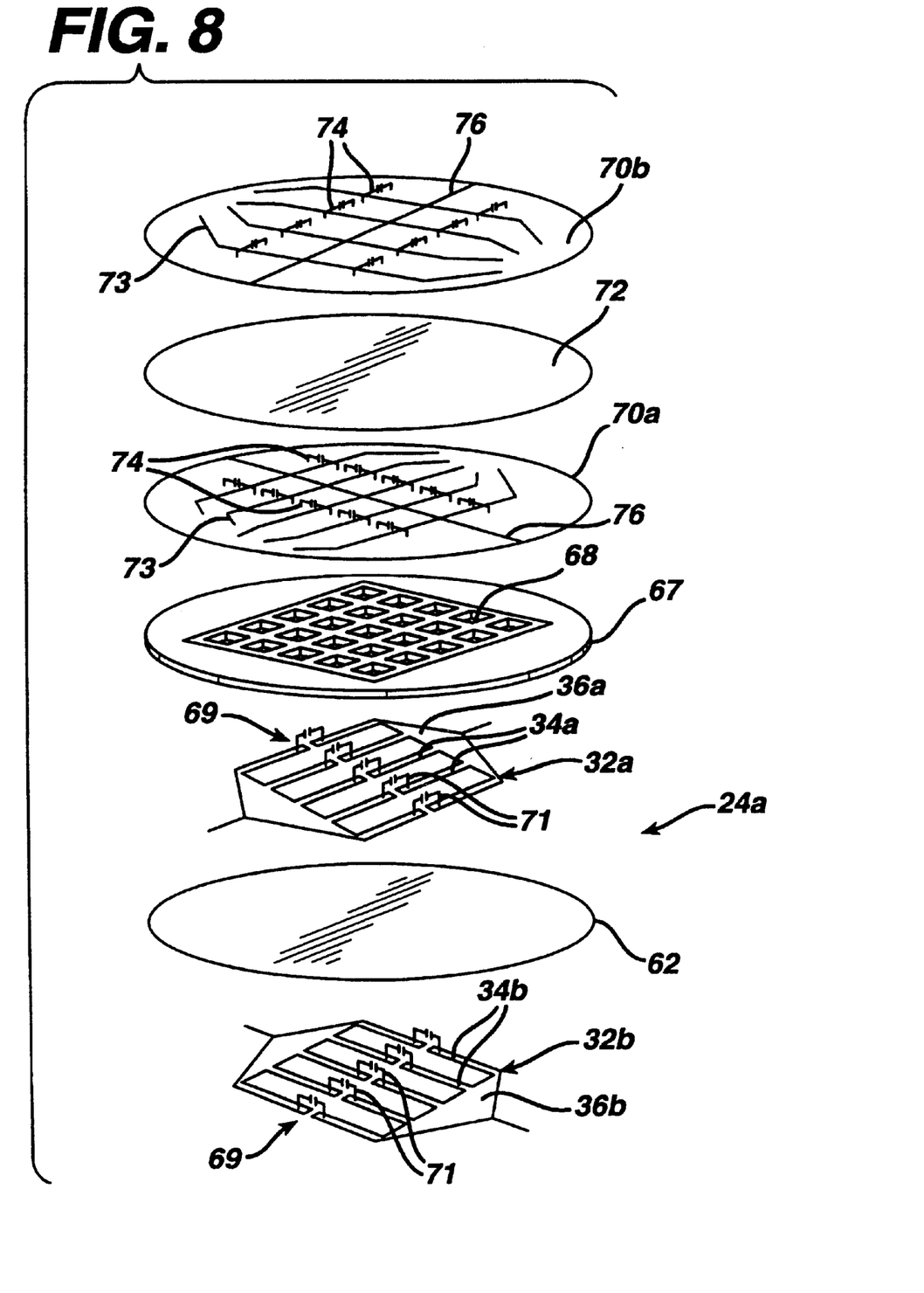
FIG. 8 is an exploded perspective view of one quadrature coil set showing an RF shield suitable for use with the coil of the invention.

As shown in FIG. 8, RF coil 24a may be fabricated by producing conductor arrays 32a and 32b (or 32c and 32d) as etched copper traces on opposite sides of an insulating substrate 62 according to well-known printed circuit techniques. The conductor arrays thus may comprise copper foil laminated on substrate 62.

In FIG. 5, the close proximity of two orthogonal conductor arrays 32a and 32b results in a parasitic capacitance 64 at each point where conductor elements 34a of conductor array 32a cross conductor elements 34b of conductor array 32b. These parasitic capacitances impair the electrical isolation of conductor arrays 32a and 32b, the condition of isolation being required for maximum signal-to-noise ratio in a quadrature coil. Accordingly, conductor arrays 32a and 32b may be re-isolated by connecting an isolation circuit 66 between conductor arrays 32a and 32b, the isolation circuit having a impedance exactly sufficient to match parasitic capacitance 64, in this instance through an inductance that creates with capacitance 64 a parallel resonant circuit having a peak impedance at the RF frequency matching the Larmor frequency for which the RF coil is intended. In the event that parasitic inductance (not shown) dominates, isolation circuit 66 may be an adjustable capacitor. Alternatively, isolation circuit 66 may provide a fixed inductance, which is easier to fabricate, and may be adjusted by a parallel or series connected adjustable capacitor to provide the same effect.

In the embodiment shown in FIG. 8, the fixed inductance of the isolation circuit may be connected between node connectors 36a and 36b of conductor arrays 32a and 32b, respectively, through a small hole (not shown) cut in substrate 62. Conductor arrays 32a and 32b are mounted to substrate 62, which may comprise a polyester resin impregnated fiberglass board, and may then be attached to an outer surface of a planar support structure 67 providing sufficient rigidity to resist the force of a patient placed thereupon (for the lower coil) but having cut-out sections 68 to provide that strength with a reduced amount of material so as to maximize its dielectric constant. Positioned at one side opposite conductor arrays 32a and 32b are RF shields 70a and 70b, fabricated as copper foil traces laminated to an insulating substrate 72 in much the same manner as conductor arrays 32a and 32b are attached to substrate 62. RF shields 70a and 70b provide a conductive plane that prevents interference between gradient coils (shown as coils 30 in FIG. 3) and conductor arrays 32a and 32b. While a continuous copper shield would provide such reduction in interference, it would promote conduction of eddy currents, distorting and sapping energy from the gradient coils. Accordingly, shields 70a and 70b include channels 73 of removed copper material extending parallel to conductor elements 34a of conductor array 32a for shield 70a and parallel to conductor elements 34b of conductor array 32b for shield 70b with the channels positioned in each instance to lie approximately midway between the respective conductor elements. Channels 73 are essentially parallel on each side of substrate 72, but may converge at their ends if the shields are used for return paths per the parallel connection of the conductor arrays.

The RF shielding capability of shields 70a and 70b is increased by providing small capacitances 74 bridging channels 73 and adjusted so as to be an open circuit (or high impedance) at the frequencies associated with the gradient coils but a closed circuit (or low impedance) at the much higher frequencies associated with the RF signals. An equatorial channel 76 may be added, cutting perpendicularly midway across the channels 73 for further reduction of eddy currents.

The effect of eddy currents from gradient coils 30 on conductor arrays 32a and 32b may be further reduced by a second equatorial channel 69 severing each of conductor elements 34a and 34b midway along their length. The gaps are again bridged by capacitive elements 71 selected to be substantially open circuits at the frequencies associated with the gradient coils but closed circuits at the higher RF frequencies associated with RF coil Capacitive elements 71 provide a resonance with the coil at the Larmor frequency of the nuclear spins, turning each conductor element 34a and 34b into a half-wave resonance conductor. In this way, capacitive element 71 also limits build-up of free charge along the conductor surfaces, thus limiting undesirable effects of capacitive coupling between the conductor elements and any of the subject being imaged and other conductive surfaces within the MRI machine.

Increasing the thickness of support structure 67, which is of a low dielectric material to eliminate dielectric losses, reduces interaction between RF coil 24a and the gradient coils, as does increasing the dielectric constant of support structure 67. However, if the thickness of support structure 67 is too great, the overall coil structure will intrude upon the imaging volume.

Accordingly, it will be understood that an extremely compact coil may be provided for an open frame MRI system with the principal dimension being determined by the support structure 67 separating conductor arrays 32a and 32b from shields 70a and 70b on one side of the opening for patient access and by similar support structure separating a second pair of conductor arrays from a second pair of shields on the other side of the opening for patient access.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. A quadrature coil for operation at a radio frequency in an open MRI system, the MRI system having a polarizing magnet with opposed pole faces for establishing therebetween a polarizing field axis, the coil comprising, a first conductor array providing separated and substantially parallel conductor elements positioned along a first conductor axis extending across the polarizing field axis to opposed, common connection points;

a second conductor array providing separated and substantially parallel conductor elements positioned along a second conductor axis extending across the polarizing field axis to opposed, connection points and substantially perpendicular to the first conductor elements;

a combiner/splitter electrically communicating with a connection point of each of the first and second conductor arrays to join the connection points with a signal line so that a signal path between said signal line and the common connection point of the first conductor array has a substantially 90 degree phase difference from a signal path between the common signal line and the connection point of the second conductor array; and an isolation circuit coupled between the first and second conductor arrays to act as a blocking parallel resonance at the radio frequency.

2. The quadrature coil of claim 1 wherein the isolation circuit comprises an adjustable inductor for establishing a parallel resonance in combination with a parasitic capacitive coupling between overlying conductors of the first and second conductor arrays.

3. The quadrature coil of claim 1 wherein the first and second conductor arrays comprise copper foil laminated to opposite sides of a planar insulating substrate and wherein the isolation circuit is coupled to adjacent connection points on opposite sides of the planar insulating substrate.

4. A quadrature coil for operation at a radio frequency in an open MRI system, the MRI system having a polarizing magnet with opposed pole faces for establishing therebetween a polarizing field axis (B0), the coil comprising:

a first conductor array providing separated and substantially parallel conductor elements positioned along a first conductor axis extending across the polarizing field axis to opposed connection points;

a second conductor array providing separated and substantially parallel conductor elements positioned along a second conductor axis extending across the polarizing field axis and substantially perpendicular to the first conductor array to opposed connection points;

an RF shield positioned between an adjacent pole face and the first and second conductor arrays for providing a conductive surface interrupted by channels substantially aligned with both the first and second conductor axis; and a combiner/splitter electrically communicating with a connection point of each of the first and second conductor arrays to join the connection points with a signal line so that the signal path between said signal line and the connection point of the first conductor array has a substantially 90 degree phase when compared with the signal path between the common signal line and the connection point of the second conductor array.

5. The radio frequency coil of claim 4 wherein the channels aligned with the first conductor axis are on a first conductive sheet and the channels aligned with the second conductive axis are on a second conductive sheet adjacent to the first conductive sheet.

6. The radio frequency coil of claim 4 wherein the channels are bridged by capacitors sized to provide low admittance at the radio frequency.

7. The radio frequency coil of claim 5 wherein the first and second conductive sheets comprise copper foil laminated to opposite sides of a planar insulating substrate.

8. A quadrature coil set for operation at a radio frequency in an open MRI system, the MRI system having a polarizing magnet with opposed pole faces for establishing therebetween a polarizing field axis, the coil comprising:

A.) a first quadrature coil positioned at a first pole face and having
  (a) a first conductor array providing separated and substantially parallel conductor elements positioned along a first conductor axis extending across the polarizing field axis to opposed connection points, and
  (b) a second conductor array providing separated and substantially parallel conductor elements positioned along a second conductor axis extending across the polarizing field axis to opposed connection points in a direction substantially perpendicular to the first conductor array;

B.) a second quadrature coil positioned at a second pole face and having:
  (a) a third conductor array providing separated and substantially parallel conductor elements positioned along the first conductor axis extending across the polarizing field axis to opposed connection points,
  (b) a fourth conductor array providing separated and substantially parallel conductor elements positioned along the second conductor axis extending across the polarizing field axis to opposed connection points in a direction substantially perpendicular to the first conductor array;

C.) interconnection leads connecting the first and third conductor arrays in series through their connection points; and D.) interconnection leads connecting the second and fourth conductor arrays in series through their connection points;
  whereby current flow direction through the first and third conductor arrays is opposite to current flow direction through the second and fourth conductor arrays, respectively.

9. The radio frequency coil of claim 8 further including a combiner/splitter joining the interconnection leads of the first and third conductor arrays and the interconnection leads of the second and fourth conductor arrays so as to promote a respective quadrature current flow between the first and second quadrature coil sets.

* * * * *